United States Patent
Iida et al.

(10) Patent No.: US 6,658,216 B1
(45) Date of Patent: Dec. 2, 2003

(54) VOLTAGE CONTROLLED OSCILLATOR, FM SIGNAL OPTICAL TRANSMITTER, FM SIGNAL OPTICAL RECEIVER AND FM SIGNAL OPTICAL TRANSMISSION SYSTEM

(75) Inventors: Masanori Iida, Katano (JP); Hisashi Adachi, Mino (JP); Hiroyuki Asakura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/531,341

(22) Filed: Mar. 20, 2000

(30) Foreign Application Priority Data

Mar. 31, 1999 (JP) .............................. 11-093334

(51) Int. Cl.⁷ .......................... H04B 10/12; H04B 10/00
(52) U.S. Cl. ....................... 398/187; 398/163
(58) Field of Search ................. 359/182, 154, 359/162; 331/177 R; 398/187, 163

(56) References Cited

U.S. PATENT DOCUMENTS

| | | | |
|---|---|---|---|
| 6,016,426 A | * | 1/2000 | Bodell .................... 455/422 |
| 6,091,932 A | * | 7/2000 | Langlais ................... 725/111 |
| 6,091,940 A | * | 7/2000 | Sorrells et al. ............ 455/118 |

FOREIGN PATENT DOCUMENTS

| | | |
|---|---|---|
| EP | 0 461 937 A | 12/1991 |
| EP | 0 503 512 A | 9/1992 |
| JP | 2700622 | 10/1997 |
| JP | 11-41171 | 2/1999 |

OTHER PUBLICATIONS

J. Chen et al., "FM Subcarrier Fiber Optical Transmission System Design and Its Application in Next–Generation Wireless Access", Journal of Lightwave Technology, vol. 16, No. 7, Jul. 1998.*

T. Nakagawa et al., "New MMIC's for Tuners in Multichannel Video Distribution Systems Using Optical Fiber Networks", IEEE Transactions on Microwave Theory and Techniques, vol. 43, No. 7, Jul. 1995.*

G. Chang et al., "Clear Channel Transmission of ATM/SONET and Subcarrier Multiplexed Signals in a Reconfigurable Multiwavelength All–Optical Network Testbed", IEEE Photonics Technology Letters, vol. 8, No. 10, Oct. 1996.*

* cited by examiner

Primary Examiner—Leslie Pascal
Assistant Examiner—Shi K. Li
(74) Attorney, Agent, or Firm—Smith, Gambrell & Russell, LLP

(57) ABSTRACT

Plural subcarrier-multiplexed AM signals 30 are input and narrow-band-FM-modulated by a voltage controlled oscillator 4 including the fundamental carrier wave and higher-order harmonics as the output, and the FM carrier wave component of the higher-order harmonics of the fundamental carrier wave is selectively taken out by a band-rejection filter 5, shifted to the lower frequency side by a frequency converter 7, converted into an optical signal by an electric/optic converter 3 and transmitted.

7 Claims, 6 Drawing Sheets

VOLTAGE CONTROLLED OSCILLATOR, FM SIGNAL OPTICAL TRANSMITTER, FM SIGNAL OPTICAL RECEIVER AND FM SIGNAL OPTICAL TRANSMISSION SYSTEM

BACKGROUND OF THE INVENTION

1. Field of the Invention

The present invention relates to an optical transmission system used for optical communication, CATV, optical measurement, mobile communication and the like, and also relates to a voltage controlled oscillator used for the optical transmission system.

2. Description of the Related Art

In recent years, in video monitoring systems, CATV, subscriber systems, mobile communication systems and the like, optical transmission of multi-channel video and audio signals or data has gotten into practical use by making full use of the low loss and wideband characteristics of optical fibers. In these systems, multi-channel signals are electrically multiplexed by a plurality of subcarriers having different frequencies to obtain AM signals, and the AM signals are converted into an optical signal by directly modulating a semiconductor laser or the like and transmitted via an optical fiber. The modem for the video optical transmission of the AM signals is simple in structure and low in cost; however, the receiver requires high optical input power to obtain a C/N ratio (carrier-to-noise ratio) for ensuring desired video quality. In addition, in mobile communication, the intensity levels of audio and data signals to be transmitted change significantly depending on the movement of terminals; therefore, a high dynamic range is required to cope with the signal change. Furthermore, transmission is apt to be adversely affected by distortion due to reflected waves during optical conversion at the semiconductor laser or in the middle of transmission via the optical fiber, thereby causing a problem. Moreover, an amplifier having excellent linearity is required for an AM signal amplifier.

A system has been proposed wherein AM signals multiplexed by subcarriers so as to enhance resistance against distortion and noise are converted into an FM signal as a whole and transmitted optically. The modulation index is required to be increased to obtain a desired C/N ratio in optical transmission. Accordingly, a system has also been proposed wherein the frequency of a semiconductor laser is modulated directly to obtain an FM signal having a high modulation index.

FIG. 6 is a view showing the configuration of a conventional FM signal optical transmission system. The AM/FM converter 62 of a transmitter 61 directly modulates a semiconductor laser 41 by using multi-channel AM video signals and outputs an optical frequency-modulated signal. Optical amplitude modulation and oscillation frequency modulation are carried out simultaneously by directly modulating the semiconductor laser 41 by using AM signals 30. By a multiplexer 43, this optical signal is multiplexed with the light of a local oscillation light source 42 having an oscillation frequency slightly different from that of the optical signal, input to a photodiode 44, and optically heterodyne-detected, thereby obtaining an FM-modulated signal having a wideband (1 to 6 GH for example) as a beat signal for the two lasers. An electric/optic converter 63 directly modulates a transmission semiconductor laser 69 by using a semiconductor laser drive amplifier 68 to convert the FM-modulated signal into an optical signal, and the optical signal is transmitted via an optical fiber 72 (Patent Publication No. 2700622 for example).

Hereafter, the optical signal is amplified by an optical amplifier or the like, and transmitted to individual receivers via optical branching devices. Only one receiver 73 is shown here. At the receiver 73, an optic/electric converter 75 converts the optical signal into an electric signal by using a photo-detector 76, amplifies the electric signal by using a preamplifier 77, and then an FM demodulator 74 demodulates the electric signal into the original AM signals 31. This FM demodulator 74 is a delay-type demodulation circuit comprising high-speed logic ICs 51 and 53 (AND gates for example), a delay device 52 and a low-pass filter 54 via a limiter amplifier 50, and is capable of carrying out wideband demodulation.

However, in the above-mentioned system, when AM signals are converted into an FM signal, the phase noise of the semiconductor laser is added to the FM signal, thereby lowering the C/N ratio. Therefore, even if the intensity of optical reception is raised, it is impossible to improve the sensitivity so as to have a constant C/N ratio value or more. To obtain a desired C/N ratio, a semiconductor laser is required to have an about one-tenth line width of that of a conventional semiconductor laser, and a semiconductor laser having an external oscillator structure or the like has been used. However, the semiconductor itself is expensive, and a plurality of semiconductors must be used. In order to carry out optical heterodyne detection with low noise, the temperature and drive current of the semiconductor laser must be controlled and stabilized highly accurately, whereby the configuration becomes complicated and the whole system becomes high in cost. In addition, this causes a problem of taking a longer time until the whole system operates stably after power on.

Furthermore, it is considered that AM signals are converted directly into an electrical FM signal; however, if the modulation index at the FM demodulator is increased (the degree of modulation $\geq 10\%$), distortion occurs at the FM modulator, and this distortion deteriorates the quality of the signal, whereby it is impossible to carry out satisfactory optical transmission.

Moreover, the demodulator also uses a plurality of expensive high-speed logic ICs; therefore, this causes a problem in practical utility when it is assumed to be used for subscriber systems.

SUMMARY OF THE INVENTION

In consideration of these problems in the conventional FM signal optical transmission system, the present invention is intended to provide an FM signal optical transmission system and an FM signal optical transmitter having a simple configuration, low distortion and excellent reception sensitivity, and also to provide a voltage controlled oscillator at low cost in order to attain the FM signal optical transmission system and the FM signal optical transmitter.

The 1st invention of the present invention (corresponding to claim 1) is a voltage controlled oscillator for controlling the oscillation frequency of an output signal depending on an input voltage, being characterized to receive a modulated voltage and output an FM signal having a band including a fundamental oscillation frequency and plural higher-order harmonic components of said fundamental oscillation frequency.

The 2nd invention of the present invention (corresponding to claim 2) is a voltage controlled oscillator in accordance with said 1st invention, wherein a frequency band including only the predetermined higher-order harmonic component is filtered at the output stage.

The 3rd invention of the present invention (corresponding to claim 3) is an FM signal optical transmitter comprising a signal processor for outputting an FM signal having a band including a fundamental oscillation frequency and plural higher-order harmonic components of said fundamental oscillation frequency, a band-pass filter for taking out only the predetermined-order harmonic signal component from said FM signal output from said signal processor, a frequency converter for shifting the taken-out harmonic signal component to the lower frequency side or the higher frequency side, and an electric/optic converter for converting the output signal of said frequency converter into an optical signal.

The 4th invention of the present invention (corresponding to claim 4) is an FM signal optical transmitter comprising a signal processor for outputting an FM signal having a band including a fundamental oscillation frequency and plural higher-order harmonic components of said fundamental oscillation frequency, a band-pass filter for taking out only the predetermined-order harmonic signal component from said FM signal output from said signal processor, a frequency multiplier that directly multiplies the taken-out harmonic signal component or shifts said harmonic signal component to the lower frequency side or the higher frequency side and then multiplies the shifted signal, and an electric/optic converter that directly converts the frequency-multiplied signal into an optical signal or shifts said frequency-multiplied signal to the lower frequency side or the higher frequency side and then converts the shifted signal into an optical signal, wherein the modulation degree of said frequency-multiplied signal is raised to a predetermined modulation degree at the time of multiplication.

The 5th invention of the present invention (corresponding to claim 5) is an FM signal optical transmitter in accordance with said 3rd or 4th inventions, wherein said signal processor for outputting said FM signal is a voltage controlled oscillator in accordance with said 1st or 2nd inventions, and said modulated voltage is formed of plural subcarrier-multiplexed signals.

The 6th invention of the present invention (corresponding to claim 6) is an FM signal optical transmitter in accordance with said 3rd invention, wherein a predetermined harmonic carrier wave component is extracted from some harmonic components at the output of said signal processor, and the extracted harmonic carrier wave component is used as a reference frequency source required when frequency conversion is carried by said frequency converter.

The 7th invention of the present invention (corresponding to claim 7) is an FM signal optical transmitter in accordance with said 4th invention, wherein said frequency shifting is carried out by a frequency converter, a predetermined harmonic carrier wave component is extracted from some harmonic components at the output of said signal processor, and the extracted harmonic carrier wave component is used as a reference frequency source required when frequency conversion is carried by said frequency converter.

The 8th invention of the present invention (corresponding to claim 8) is an FM signal optical receiver comprising an optic/electric converter that receives an optical signal transmitted from said FM signal optical transmitter in accordance with any one of said 3rd to 7th inventions and converts said optical signal into an electric signal, and an FM demodulator for demodulating an FM signal converted into said electric signal.

The 9th invention of the present invention (corresponding to claim 9) is an FM signal optical transmission system comprising said FM signal optical transmitter in accordance with any one of said 3rd to 7th inventions, an optic/electric converter that receives an optical signal transmitted from said FM signal optical transmitter and converts said optical signal into an electric signal, and an FM demodulator for demodulating an FM signal converted into said electric signal.

BRIEF DESCRIPTION OF THE DRAWINGS

FIG. 2($b$) is a spectral view showing an FM signal after passing a voltage controlled oscillator.

FIG. 4($b$) is a view illustrating the function of frequency shifting.

Figure 1:
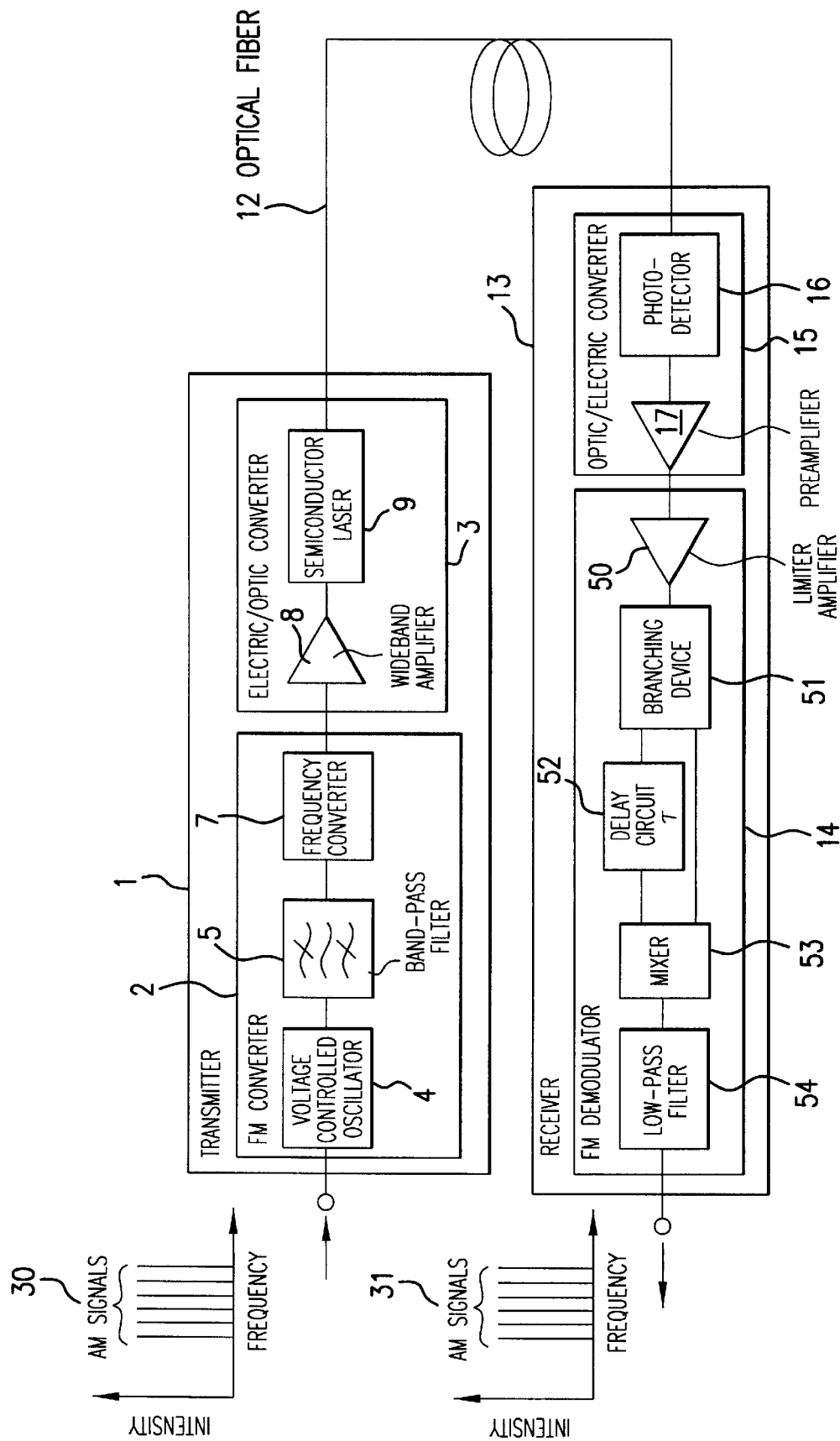
FIG. 1 is a view showing the configuration of an FM signal optical transmission system in accordance with a first embodiment of the present invention.

DESCRIPTION OF SYMBOLS 1, 61 transmitter
2 FM converter
3, 63 electric/optic converter
4 voltage controlled oscillator.
5, 6 band-pass filter
7, 11 frequency converter
8 wideband amplifier
9, 41 semiconductor laser
10 frequency multiplier
12, 72 optical fiber
13, 73 receiver

DESCRIPTION OF THE PREFERRED EMBODIMENTS

The present invention will be described below referring to the drawings showing the embodiments thereof.

Generally, an FM modulator is used to convert AM signals into an FM signal and comprises a voltage controlled oscillator and a phase modulator. The FM signal may be synthesized indirectly from the AM signals or phase-modulated signals instead of direct conversion into the FM signal.

A semiconductor laser is used as an electric/optic converter. In the present invention, it is possible to use a long-wavelength InP-based laser having a wavelength of 1.2 to 1.6 $\mu$m, a semiconductor laser having a wavelength of 0.98 $\mu$m, a GaAlAs-based laser having an oscillation wavelength of 0.78 $\mu$m and the like for example.

Furthermore, in the present invention, an ordinary optical fiber is used as an optical fiber. For this optical fiber, an ordinary fiber having a core diameter of about 10 to 300 $\mu$m is available for example. Both multi-mode and single-mode optical fibers can be used.

A frequency converter converts a frequency to a higher-frequency side or a lower-frequency side by using the frequency mixing action of a non-linear circuit device, just like a frequency multiplier.

FIRST EMBODIMENT

FIG. 1 is a view showing the configuration of an FM signal optical transmission system in accordance with a first embodiment of the present invention. Referring to FIG. 1, the present optical transmission system comprises a transmitter 1 and a receiver 13. The transmitter 1 is provided with an FM converter 2 comprising a voltage controlled oscillator 4, a band-pass filter 5 and a frequency converter 7, and an electric/optic converter 3 comprising a wideband amplifier 8 and a semiconductor laser 9. In addition, the receiver 13 is provided with an optic/electric converter 15 comprising a photo-detector (PD) 16 and a preamplifier 17, and an FM demodulator 14 comprising a limiter amplifier 50, a branching device 51, a delay circuit 52, a mixer 53 and a low-pass filter 54. An optical signal from the transmitter 1 is transmitted via an optical fiber 12 and input to the receiver 13. The transmitter 1 corresponds to the FM signal optical transmitter of the present invention. This also applies to the following embodiments in the same way.

Next, the operation of the FM signal optical transmission system in accordance with the above-mentioned first embodiment will be described below referring to the drawings.

FIG. 2 is a conceptual view showing signal spectra and illustrating the operation of the optical transmission system in accordance with the present embodiment.

The above-mentioned voltage controlled oscillator 4 may be an oscillator comprising a varactor or a reactance transistor, or a digital oscillator comprising a multivibrator.

It may be possible to generate a narrow-band FM signal by using a balanced modulator after AM signals are integrated once and phase-modulated.

Figure 2A:
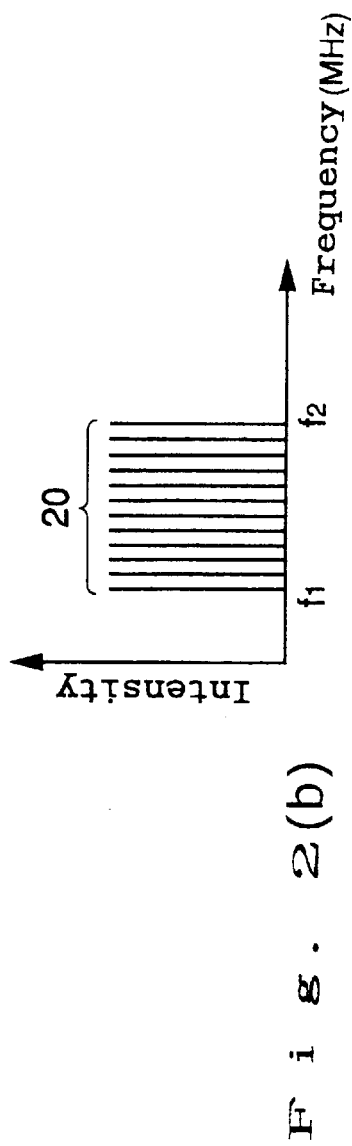
FIG. 2($a$) is a view showing an example of AM signals to be transmitted in accordance with the present invention.
Figure 2B:
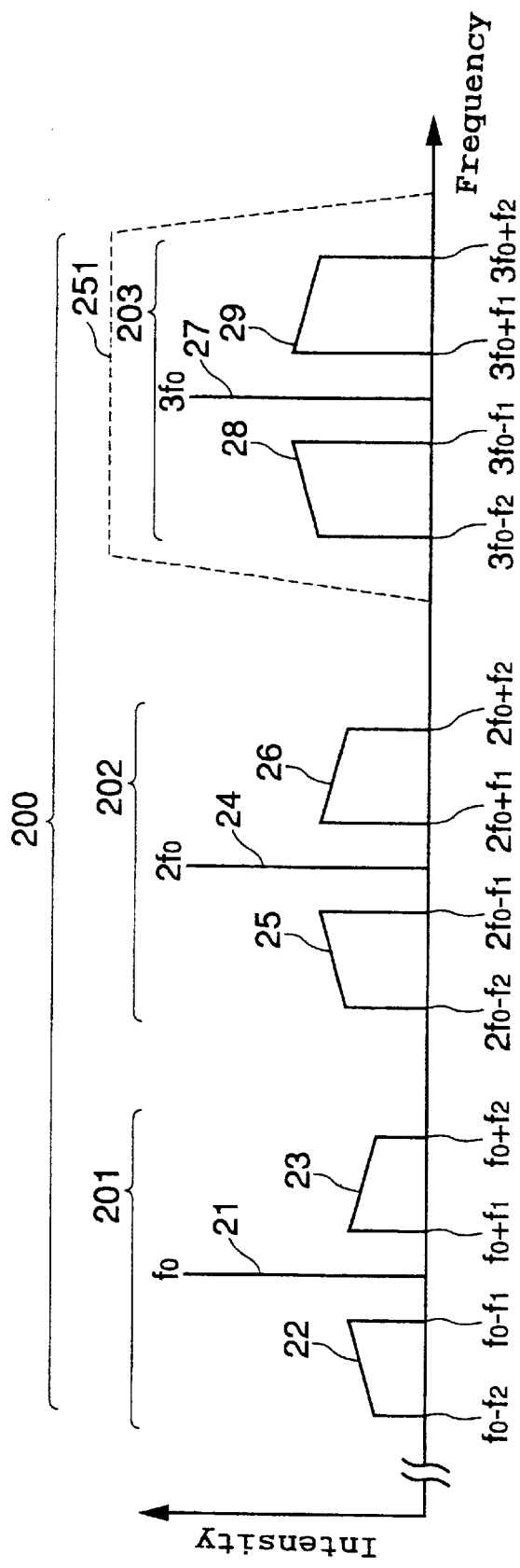

For example, such AM signals 20, i.e., multi-channel, subcarrier-multiplexed video signals, as shown in FIG. 2(a) are converted into an FM-converted signal 200 shown in FIG. 2(b) by this voltage controlled oscillator 4. This FM-converted signal 200 is obtained when an FM signal 201 for each channel of the multi-channel, subcarrier-multiplexed video signals, centered at the fundamental carrier frequency f0 of the voltage controlled oscillator 4, undergoes narrow-band FM modulation having a low degree of modulation to the extent that sidebands other than first sidebands 22 and 23 do not appear significantly. Therefore, as shown in FIG. 2(b), it is characterized that the first sidebands 22 and 23 of the fundamental carrier wave component appear at regions each being f1 away from the FM carrier wave 21 (frequency f0), and at the same time the harmonic spectra 202 and 203 (frequencies 2f0, 3f0, ... ) of the fundamental carrier wave are also output simultaneously.

In addition, in this case, it may be possible to say that a high-order harmonic component (nth-order harmonic component, n: an integer (n≧2), for example) output from the output stage of the voltage controlled oscillator 4 and selected by the band-pass filter 5 has a fundamental oscillation frequency and an input fluctuation voltage level not overlapping the (n−1)th-order and (n+1)th-order harmonic components on the frequency axis each other This FM signal 200 is input to the band-pass filter 5 having a frequency selection characteristic 251 centered at the third harmonic frequency 3f0 shown in FIG. 2(b), and this third harmonic spectrum 203 is selected and taken out as an output. In the present embodiment, a band-pass filter for passing the third harmonic is taken as an example of the band-pass filter 5; however, the order of the harmonic to be selected is not limited to this; any order may be selected depending on the output level and a desired degree of modulation of the harmonic from the voltage controlled oscillator 4. This third-order harmonic spectrum 203 has a degree of modulation three times as high as that of the FM signal 201. This third-order harmonic signal is down-converted by the frequency converter 7 such as a mixer to the lower-frequency side, i.e., into a band wherein optical transmission is possible. This FM signal having an increased degree of modulation is converted into an optical signal by the semiconductor laser 9 via the wideband amplifier 8, input to the optical fiber 12, and transmitted. The optical signal transmitted by the optical fiber 12 is input to the receiver 13.

The optical signal input to the receiver 13 is converted into an electric signal by the optic/electric converter 15 provided with the photo-detector 16 formed of a photo-detecting device, such as a photodiode or an avalanche photodiode, and the preamplifier 17, amplified to have a desired signal intensity, and demodulated into the original AM signals 31 by the FM demodulator 14. Although the FM demodulator 14 can have one of several configurations, a delay line type having excellent linearity in a wideband or a pulse count type is desirable. In the present embodiment, the delay line type is described, which comprises the branching device 51, the mixer 53 and the delay circuit 52. The mixer 53 maybe formed of a wideband balance-type mixer. Furthermore, as shown in FIG. 1, the limiter amplifier 50 for level adjustment may be connected at the front stage of the branching device 51, and the low-pass filter 54 may be connected at the rear stage of the mixer 53 as necessary in the FM demodulator 14. The FM demodulator 14 is not limited to the above-mentioned configuration but may be formed of a circuit having a frequency discrimination function, such as a double-tuning frequency discriminator, a Foster-Seeley discriminator, a ratio detector or the like.

Either the upper sideband or the lower sideband of the FM signal converted by the transmitter 1 may be transmitted. In the case when one sideband is transmitted, it is possible to reproduce the original FM-converted signal by passing the sideband through the limiter amplifier 50 at the receiver 13.

With the above-mentioned configuration, voltage fluctuation having been set at a small FM modulation degree is FM-modulated by using a voltage controlled oscillator, and the FM modulation degree is increased by not taking out the fundamental carrier wave component but by taking out its harmonic components to obtain an FM-converted signal having a desired FM modulation degree, whereby multi-channel, subcarrier-multiplexed AM signals can be converted into an FM signal as a whole by signal processing by using an electric circuit having a simple configuration, and the signal can be made suited for the optical transmission band by shifting the harmonic component of the signal to the lower frequency side.

SECOND EMBODIMENT

Figure 3:
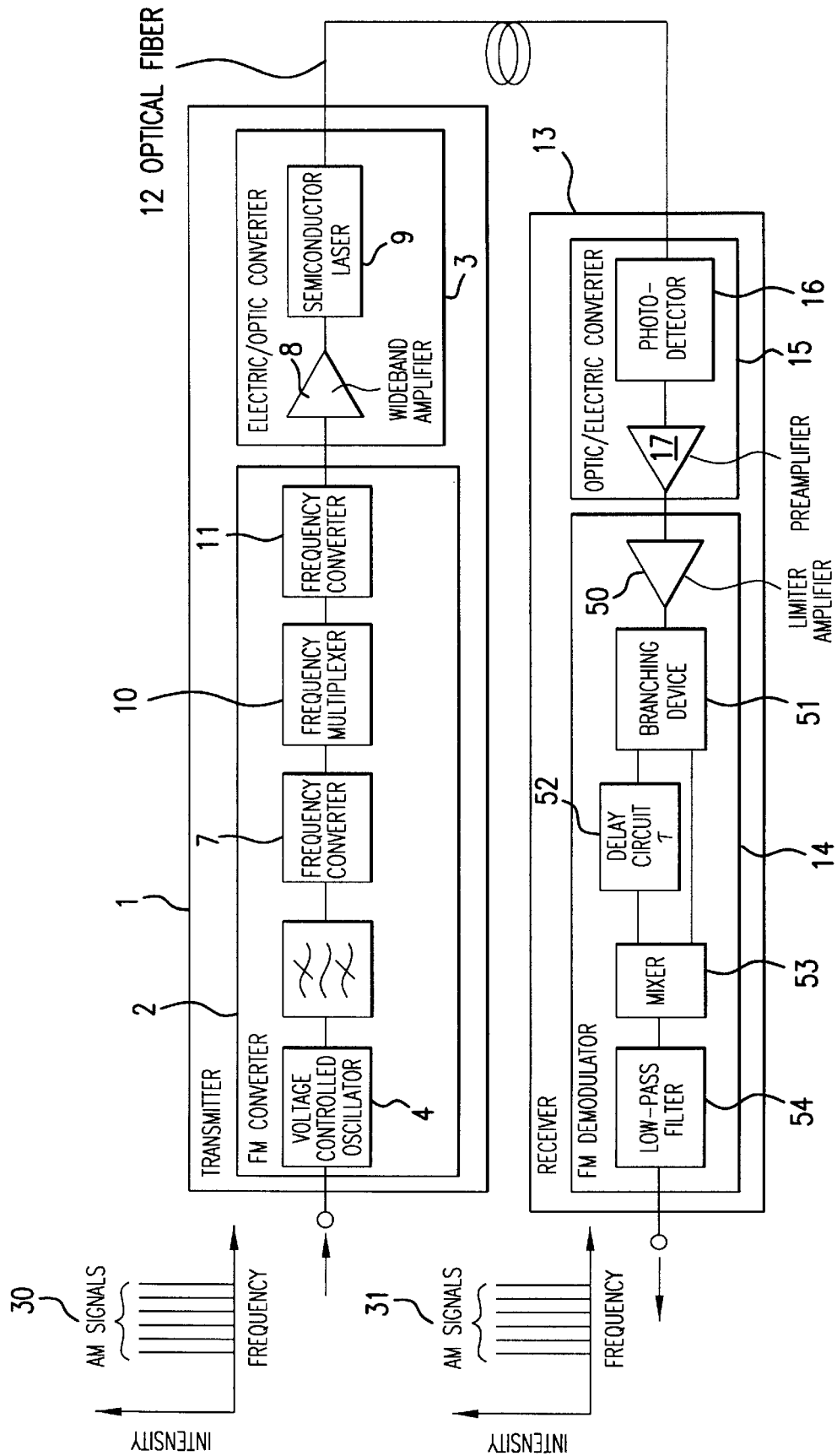
FIG. 3 is a view showing the configuration of an FM signal optical transmission system in accordance with a second embodiment of the present invention.

FIG. 3 is a view showing the configurations of the transmitter 1 and the receiver 13 of an FM signal optical transmission system in accordance with a second embodiment of the present invention. This embodiment differs from the first embodiment shown in FIG. 1 in that a frequency multiplier 10 and a frequency converter 11 are provided after a frequency converter 7. The components represented in the figure by the same numerals are the same as those shown in FIG. 1. The receiver 13 is the same as that of the first embodiment, and its explanation is omitted.

Figure 4A:
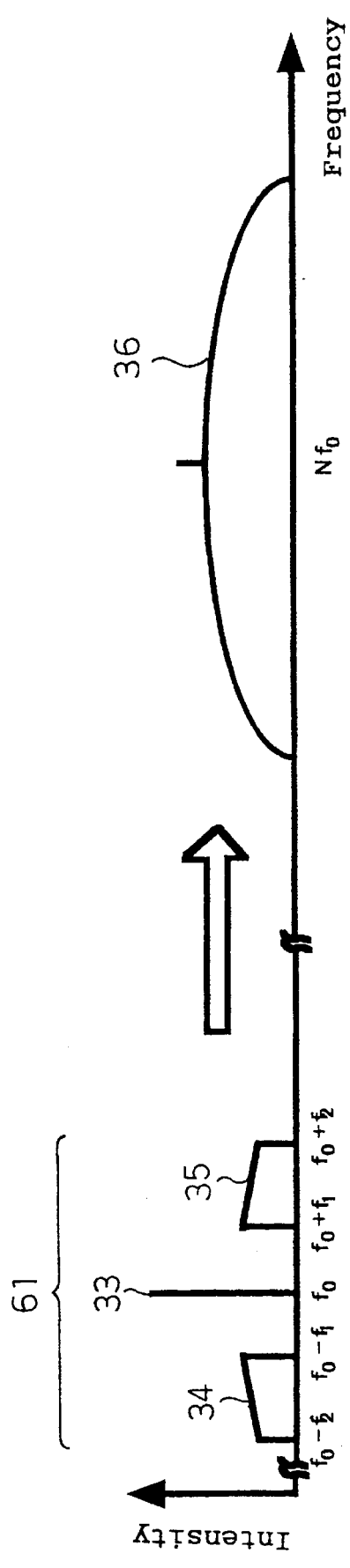
FIG. 4($a$) is a view illustrating the multiplication of an FM signal in accordance with the second embodiment.
Figure 4B:
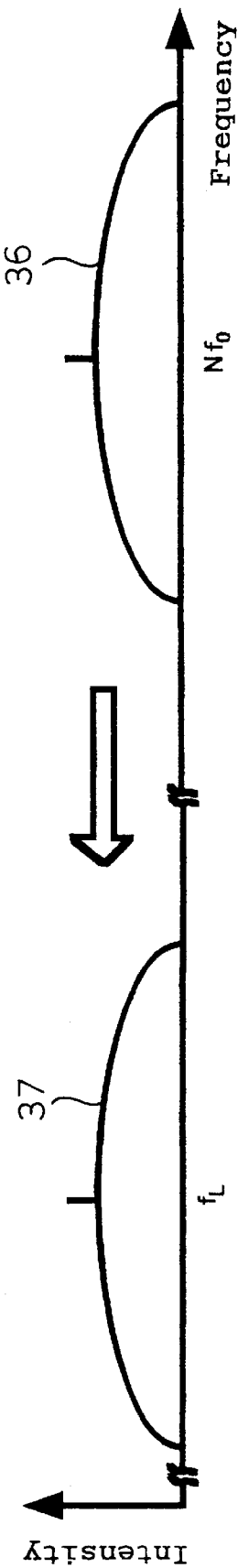

With this configuration, in addition to the effects of the first embodiment, and with respect to the FM modulation degree of the harmonic component from the voltage controlled oscillator 4, in the case when the FM modulation degree of a higher-order harmonic component is not a desired FM modulation degree due to the input/output stage band or the like of the voltage controlled oscillator 4, an FM-converted signal 61 including a carrier wave (herein, f0 for convenience) is N-multiplied (N: integer) by the frequency multiplier 10 as shown in FIG. 4(a), whereby a multiplied signal 36 is obtained and the FM modulation degree is increased and the desired modulation degree can be obtained; next, the N-multiplied signal 36 is shifted by the frequency converter 11 to the lower frequency side as shown in FIG. 4(b), whereby an FM signal 37 having an optical transmittable band can be obtained. A band-pass filter may be inserted as necessary at the rear stage of the frequency multiplier 10 or the frequency converter 11 to carry out spurious suppression.

THIRD EMBODIMENT

Figure 5:
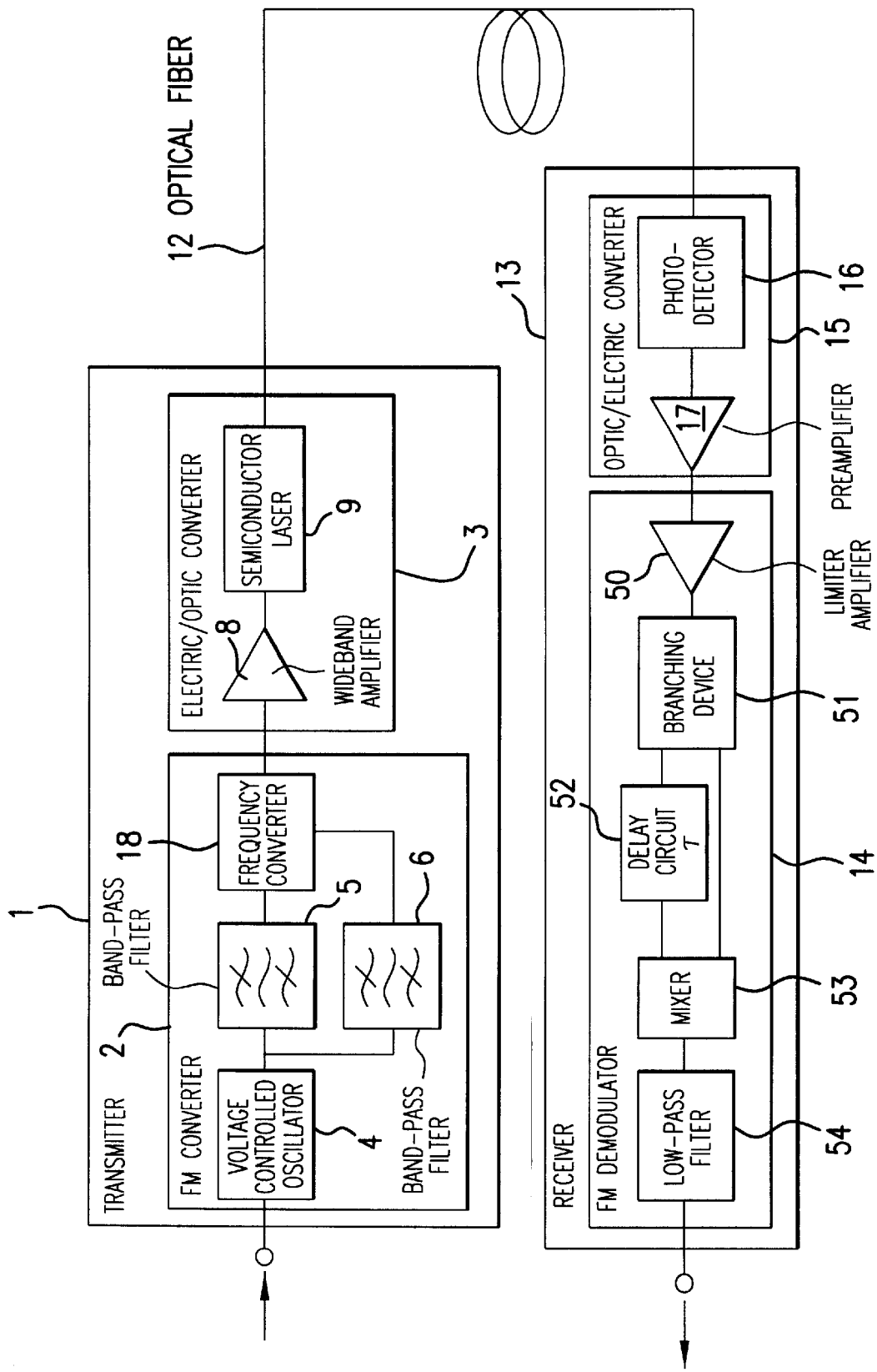
FIG. 5 is a view showing the configuration of an FM signal optical transmission system in accordance with a third embodiment of the present invention.
Figure 6:
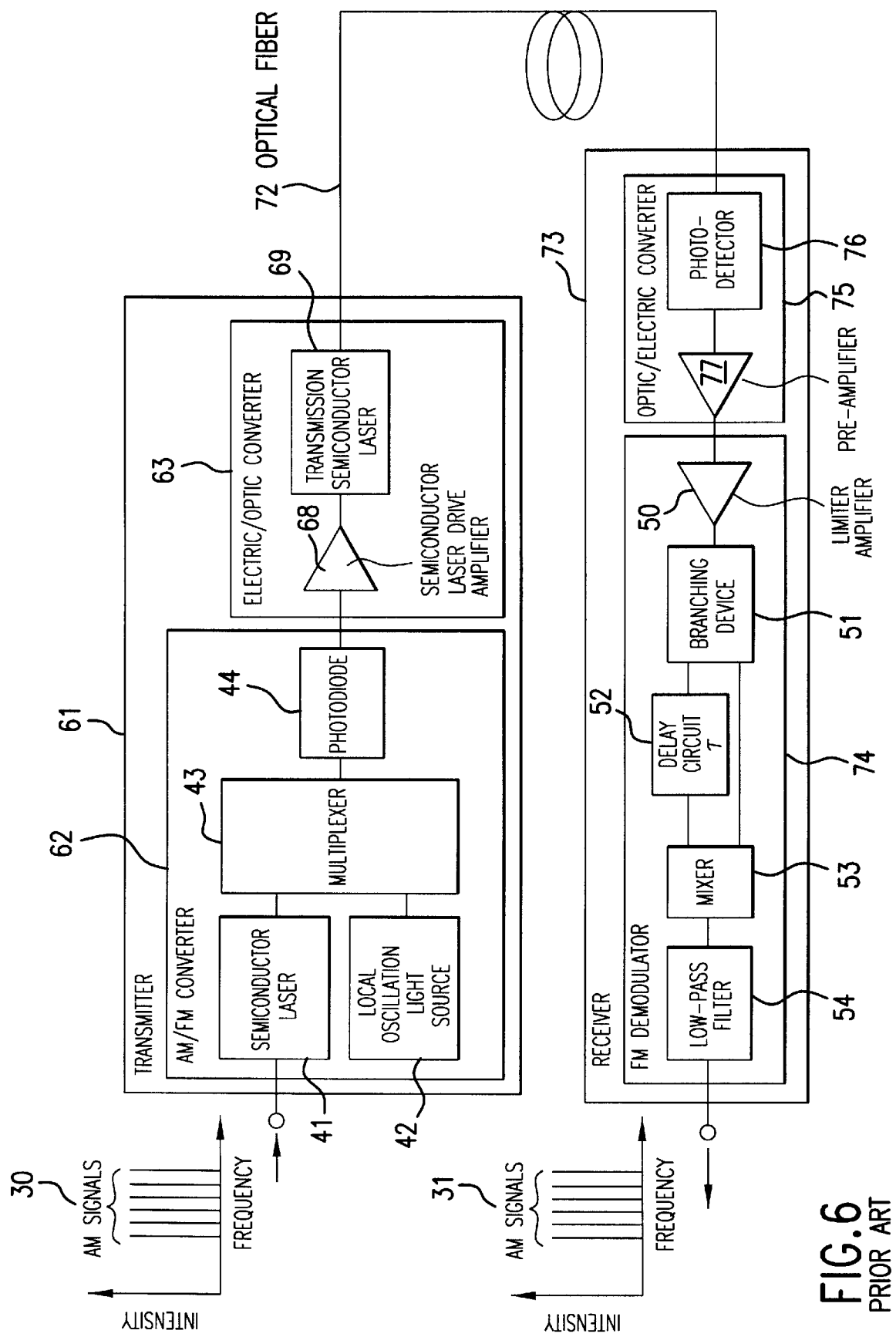
FIG. 6 is a view showing the configuration of a conventional FM signal optical transmission system.

FIG. 5 is a view showing the configuration of an FM signal optical transmission system in accordance with a third embodiment of the present invention. This embodiment differs from the first embodiment (FIG. 1) of the present invention in that a band-pass filter 6 is provided at the output of the voltage controlled oscillator 4 in parallel with the band-pass filter 5, whereby a branched signal from the voltage controlled oscillator 4 is input to the band-pass filter 6, and its output signal is input to a frequency converter 18. Unlike the band-pass filter 5, the band-pass filter 6 has a narrow-band-pass characteristic of selecting only the harmonic frequency portion of the fundamental carrier frequency f0 in the FM signal 200 (see FIG. 2) from the voltage controlled oscillator 4. In the case of a second-order harmonic for example, the band-pass filter 6 selects a second-order harmonic spectrum 202 not including sideband components 25 and 26. This second-order harmonic spectrum 202 is used as the local oscillation source of the frequency converter 18.

With this configuration, a local oscillation source individually required for the frequency converter becomes unnecessary, and it is possible to have a configuration wherein the harmonic components of the voltage controlled oscillator can be used effectively. In the present embodiment, the band-pass filter 6 used to select the second-order harmonic is taken as an example; however, without being limited to this, it may be possible to have a characteristic wherein a higher-order harmonic around the local oscillation frequency required for carrying out shifting to the optical transmission band is selected.

As described above, the present invention typically relates to an FM signal optical transmitter for converting multichannel AM signals into an FM signal, and also relates to an FM signal optical transmission system including the FM signal optical transmitter, wherein plural subcarrier-multiplexed signals are narrow-band-FM-modulated by a voltage controlled oscillator including the fundamental carrier wave and higher-order harmonics as the output, and the FM carrier wave component of the higher-order harmonics of the fundamental carrier wave is selectively taken out by a band-rejection filter, shifted to the lower frequency side by a frequency converter, converted into an optical signal and transmitted.

The subcarrier-multiplexed signals of the present invention are not limited to AM signals; the signals may be any given modulated signals, such as phase-modulated, FM-modulated or digitally modulated signals.

In addition, in the case of an embodiment wherein the frequency is multiplied by a frequency multiplier, the shifting is carried out to the lower frequency side before multiplication in the above-mentioned embodiment; however, if optical processing is possible, the shifting may be carried out to the higher frequency side. Alternatively, if optical processing is possible, the shifting may not be carried out.

Furthermore, although the shifting is carried out to the lower frequency side after multiplication, if optical processing is possible, the shifting may be carried out to the higher frequency side. Alternatively, if optical processing is possible, the shifting may not be carried out.

As clarified by the above-mentioned descriptions, in the present invention, plural subcarrier-multiplexed signals are narrow-band-FM-modulated by a voltage controlled oscillator including the fundamental carrier wave and higher-order harmonics as the output, and the FM carrier wave component of the higher-order harmonics of the fundamental carrier wave is selectively taken out by a band-rejection filter, shifted to the lower frequency side by a frequency converter, converted into an optical signal and transmitted, whereby an FM signal capable of being transmitted via an optical fiber can be generated by using a simple configuration, thereby having the advantages of excellent stability and reliability and low cost.

What is claimed is:

1. An FM signal optical transmitter comprising a signal processor for outputting an FM signal having a band including a fundamental oscillation frequency and plural higher-order harmonic components of said fundamental oscillation frequency, a band-pass filter for taking out only the predetermined-order harmonic signal component from said FM signal output from said signal processor, a frequency multiplier that directly multiplies the taken-out harmonic signal component or shifts said harmonic signal component to the lower frequency side or the higher frequency side and then multiplies the shifted signal, and an electric/optic converter that directly converts the frequency-multiplied signal into an optical signal or shifts said frequency-multiplied signal to the lower frequency side or the higher frequency side and then converts the shifted signal into an optical signal, wherein the modulation degree of said frequency-multiplied signal is raised to a predetermined modulation degree at the time of multiplication.

2. An FM signal optical transmitter in accordance with claim 1, wherein said frequency shifting is carried out by a frequency converter, a predetermined harmonic carrier wave component is extracted from some harmonic components at the output of said signal processor and the extracted harmonic carrier wave component is used as a reference frequency source required when frequency conversion is carried out by said frequency converter.

3. An FM signal optical receiver comprising an optic/electric converter that receives an optical signal transmitted from said FM signal optical transmitter in accordance with claim 1 or 2, and converts said optical signal into an electric signal, and an FM demodulator for demodulating an FM signal converted into said electric signal.

4. An FM signal optical transmission system comprising said FM signal optical transmitter in accordance with claim 1 or 2, an optic/electric converter that receives an optical signal transmitted from said FM signal optical transmitter and converts said optical signal into an electric signal, and an FM demodulator for demodulating an FM signal converted into said electric signal.

5. An FM signal optical transmitter in accordance with claim 1,
   wherein said modulated voltage is formed of plural subcarrier-multiplexed signals,
   wherein said voltage controlled oscillator controls the oscillation frequency of an output signal depending on an input voltage, said oscillator receiving a modulated voltage and outputting an FM signal having a band including a fundamental oscillation frequency and plural higher-order harmonic components of said fundamental oscillation frequency, and
   wherein a frequency band including only the predetermined higher-order harmonic component is filtered at the output stage.

6. An FM signal optical transmitter in accordance with claim 1,
   wherein said signal processor for outputting said FM signal is a voltage controlled oscillator, and said modulated voltage is formed of plural subcarrier-multiplexed signals, and
   wherein said voltage controlled oscillator controls the oscillation frequency of an output signal depending on an input voltage, said oscillator receiving a modulated voltage and outputting an FM signal having a band including a fundamental oscillation frequency and plural higher-order harmonic components of said fundamental oscillation frequency.

7. An FM signal optical transmitter comprising a signal processor for outputting an FM signal having a band including a fundamental oscillation frequency and plural higher-order harmonic components of said fundamental oscillation frequency, a band-pass filter for taking out only a predetermined-order harmonic signal component from said FM signal output from said signal processor, a frequency converter for shifting the taken-out harmonic signal component to the lower frequency side or the higher frequency side, and an electric/optic converter for converting an output signal of said frequency converter into an optical signal,
   wherein a predetermined harmonic carrier wave component is extracted from some harmonic components at the output of said signal processor, and the extracted harmonic carrier wave component is used as a reference frequency source required when frequency conversion is carried out by said frequency converter.

* * * * *